US009059252B1

(12) United States Patent
Liu et al.

(10) Patent No.: US 9,059,252 B1
(45) Date of Patent: Jun. 16, 2015

(54) SILICON WAVEGUIDE ON BULK SILICON SUBSTRATE AND METHODS OF FORMING

(71) Applicant: International Business Machines Corporation, Armonk, NY (US)

(72) Inventors: Qizhi Liu, Lexington, MA (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 14/176,552

(22) Filed: Feb. 10, 2014

(51) Int. Cl.
*H01L 21/8236* (2006.01)
*H01L 21/336* (2006.01)
*H01L 21/768* (2006.01)

(52) U.S. Cl.
CPC ..... *H01L 21/7682* (2013.01); *H01L 2223/6627* (2013.01)

(58) Field of Classification Search
CPC .............. H01L 2924/00; H01L 2924/00014; H01L 2924/3011; H01L 2224/32225; H01L 2224/48227; H01L 2224/73265; H01L 2224/73204; H01L 2224/32145; H01L 2924/15311; H01L 21/823807; H01L 21/823892; H01L 27/0928
USPC ............. 257/98, E33.003, E33.067, E21.252; 438/277, 31, 53, 619
See application file for complete search history.

(56) References Cited

U.S. PATENT DOCUMENTS

| | | | |
|---|---|---|---|
| 6,575,641 B2 | 6/2003 | Yamabayashi et al. | |
| 6,993,215 B2 | 1/2006 | Bruel | |
| 7,174,072 B2 | 2/2007 | Oohara et al. | |
| 7,379,633 B1 | 5/2008 | Ashley et al. | |
| 7,471,866 B2 | 12/2008 | Dumais et al. | |
| 7,590,326 B2 | 9/2009 | Fincato et al. | |
| 8,299,485 B2 | 10/2012 | Celler | |
| 8,437,585 B2 | 5/2013 | Na | |
| 2004/0188379 A1 | 9/2004 | Mikolas | |
| 2005/0029619 A1* | 2/2005 | Forbes | 257/516 |
| 2006/0121679 A1* | 6/2006 | Lee et al. | 438/300 |
| 2008/0317423 A1* | 12/2008 | Stepanov et al. | 385/132 |

OTHER PUBLICATIONS

Kim et al, "Fabrication of epitaxial SiGe optical waveguide structures", First International SiGe Technology and Device Meeting (ISTDM 2003) From Materials and Process Technology to Device and Circuit Technology, Jan. 15-17, 2003, Nagoya, Japan, Journal of Applied Surface Science, vol. 224, No. 1-4, pp. 175-178, Mar. 15, 2004.
Li et al., "Two-mode interference photonic waveguide switch", Journal of Lightwave Technology, vol. 21, No. 7, pp. 1685-1690, Jul. 2003.

* cited by examiner

*Primary Examiner* — Thao X Le
*Assistant Examiner* — Nduka Ojeh
(74) *Attorney, Agent, or Firm* — Michael J. LeStrange; Hoffman Warnick LLC

(57) ABSTRACT

Various methods include: forming a first set of trenches in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of trenches each expose the silicon substrate and internal sidewalls of the first oxide; undercut etching the silicon substrate in a direction perpendicular to the crystal direction of the silicon substrate to form a cavity corresponding with each of the first set of trenches; and partially filling each cavity with a dielectric, leaving an air gap within each cavity connected with an air gap in an adjacent cavity.

19 Claims, 11 Drawing Sheets

SILICON WAVEGUIDE ON BULK SILICON SUBSTRATE AND METHODS OF FORMING

BACKGROUND

The subject matter disclosed herein relates to optical devices. More particularly, the subject matter relates to silicon-based optical devices.

As devices relying upon integrated circuits (ICs) have increased in complexity and functionality, those devices have required ever more dynamic ICs to meet the demands of those device users. IC photonic (optical) devices are conventionally built on silicon-on-insulator (SOI) substrates, and these SOI substrates have been used to build circuits capable of switching at these fast speeds. The SOI substrates include a buried oxide (BOx) substrate that enhances the efficiency of the optical properties in the device. The BOx substrate is conventionally a thick layer (e.g., approximately 2 micrometers), with a greater thickness than the transmitted wavelength of the light source (e.g., infra-red light source). This thickness allows for low-loss optical light transmission. However, SOI substrates (e.g., BOx substrates) can be expensive to procure, making them less practicable for use.

BRIEF DESCRIPTION

Various embodiments include field effect transistors (FETs) and methods of forming such FETs. One method includes: forming a first set of trenches in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of trenches each expose the silicon substrate; undercut etching the silicon substrate in a direction perpendicular to the crystal direction of the silicon substrate to form a cavity corresponding with each of the first set of trenches; passivating an upper surface of the sacrificial layer; and partially filling each cavity with a dielectric.

A first aspect includes a method including: forming a first set of trenches in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of trenches each expose the silicon substrate; undercut etching the silicon substrate in a direction perpendicular to the crystal direction of the silicon substrate to form a cavity corresponding with each of the first set of trenches; passivating an upper surface of the sacrificial layer; and partially filling each cavity with a dielectric.

A second aspect includes a method including: forming a first set of trenches in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of trenches each expose the silicon substrate and internal sidewalls of the first oxide; undercut etching the silicon substrate in a direction perpendicular to the crystal direction of the silicon substrate to form a cavity corresponding with each of the first set of trenches; and partially filling each cavity with a dielectric, leaving an air gap within each cavity connected with an air gap in an adjacent cavity, wherein the partially filling of each cavity with the dielectric includes filling a portion of each cavity to leave the air gap in each cavity, the air gap surrounded by the dielectric.

A third aspect includes a silicon waveguide structure including: a silicon substrate; a first oxide substantially abutting the silicon substrate; a silicon layer overlying the silicon substrate; a second oxide overlying the silicon layer; a set of cavities extending into at least one of the silicon substrate or the first oxide; a third oxide partially filling the set of cavities and extending above the silicon layer; and an air gap in each of the set of cavities and extending between sets of adjacent cavities, the air gap surrounded by the third oxide except for a connection with the air gap in the adjacent cavity.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 9 also shows a FET structure resulting from the processes described with reference to FIGS. 1-9.

Figure 1A:
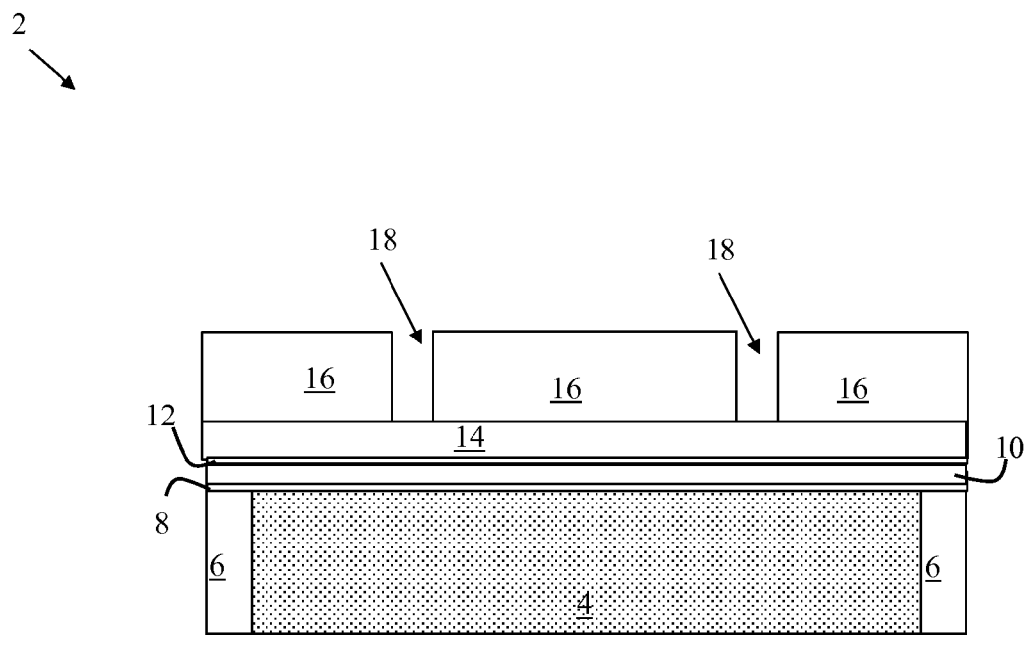
FIGS. 1-9 (including FIG. 1A, FIG. 1B, FIG. 2A, FIG. 2B, FIG. 4A and FIG. 4B) show cross-sectional views of integrated circuit (IC) structures which illustrate processes in various methods of forming a silicon waveguide structure according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to optical devices. More particularly, the subject matter relates to silicon-based optical devices.

As described herein, IC photonic (optical) devices that are conventionally built on silicon-on-insulator (SOI) substrates have been used to build circuits capable of switching at these fast speeds. The SOI substrates include a buried oxide (BOX) substrate that enables the efficiency of the optical properties in the device. The BOX layer is conventionally a thick layer (e.g., approximately 2 micrometers), with a greater thickness than the transmitted wavelength of the light source (e.g., infra-red light source). The optical properties of the BOX layer, and the designed optical waveguide structures including the aforementioned thickness value of the BOX layer, allows for low-loss optical light transmission. However, SOI substrates can be expensive to procure when compared with bulk Si substrates, increasing the cost of the technology based upon these SOI substrates.

In contrast to conventional IC optic devices with SOI (BOX) substrates, various devices disclosed herein are formed on bulk silicon substrates, thus reducing costs and complexity of manufacturing when compared with the conventional IC optic devices. Various particular embodiments include methods of forming IC optical devices.

In some particular embodiments a method includes: forming a first set of trenches in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of trenches each expose the silicon substrate and internal sidewalls of the first oxide; undercut etching the silicon substrate in a direction perpendicular to the crystal direction of the silicon substrate to form a cavity corresponding with each of the first set of trenches; and partially filling each cavity with a dielectric, leaving an air gap within each cavity connected with an air gap in an adjacent cavity.

In other particular embodiments, a method includes: forming a first set of trenches in a precursor structure having: a silicon substrate having a crystal direction, the silicon substrate substantially abutted by a first oxide; a silicon germanium (SiGe) layer overlying the silicon substrate; a silicon layer overlying the SiGe layer; a second oxide overlying the silicon layer; and a sacrificial layer overlying the second oxide, wherein the first set of trenches each expose the silicon substrate and internal sidewalls of the first oxide; undercut etching the silicon substrate in a direction perpendicular to the crystal direction of the silicon substrate to form a cavity corresponding with each of the first set of trenches; performing an isotropic reactive ion etch (RIE) on the SiGe layer after the undercut etching to remove the SiGe layer along a bottom surface of the silicon layer within each cavity, exposing the bottom surface of the silicon layer within each cavity (in some embodiments); and partially filling each cavity with a dielectric, leaving an air gap within each cavity connected with an air gap in an adjacent cavity, wherein the partially filling of each cavity with the dielectric includes filling a portion of each cavity to leave the air gap in each cavity, the air gap surrounded by the dielectric.

Various additional particular embodiments include a silicon waveguide structure having: a silicon substrate; a first oxide substantially abutting the silicon substrate; a silicon layer overlying the SiGe layer; a second oxide overlying the silicon layer; a set of cavities extending into at least one of the silicon substrate or the first oxide; a third oxide partially filling the set of cavities and extending above the silicon layer; and an air gap in each of the set of cavities and extending between sets of adjacent cavities, the air gap surrounded by the third oxide except for a connection with the air gap in the adjacent cavity.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

FIGS. 1-9 (including FIG. 1A, FIG. 1B, FIG. 2A, FIG. 2B, FIG. 4A and FIG. 4B) show cross-sectional views of integrated circuit (IC) structures which illustrate processes in various methods of forming a silicon waveguide structure according to various embodiments. FIG. 1A illustrates an optional pre-process in forming a first set of trenches in a precursor structure 2. As shown, the precursor structure can include: a silicon substrate 4 having a crystal direction (c), directed into the page. The silicon substrate 4 can be formed of a bulk silicon, as described herein. Abutting (contacting on a side) the silicon substrate 4 is a first oxide 6, e.g., silicon dioxide $SiO_2$. Overlying the silicon substrate 4 and the first oxide 6 is a silicon germanium (SiGe) layer 8, which may have been blanket deposited, epitaxially grown, etc., over the silicon substrate 4 and the first oxide 6. A silicon layer 10 overlies the SiGe layer 8, and may have been blanket deposited, epitaxially grown, etc. over the SiGe layer 8. A second oxide 12 is formed over the silicon layer 10. The second oxide 12 can be formed of a similar or distinct oxide as the first oxide 6, e.g., $SiO_2$ or any other oxide known in the art. A sacrificial layer 14 is formed over the second oxide 12, and the sacrificial layer 14 may be blanket deposited over the second oxide 12. In various embodiments, the sacrificial layer 14 includes at least one of amorphous silicon (a-Si) or poly Si, SiGe, Ge and/or silicon nitride (SiN). It is understood that in various embodiments, the first oxide 6 can include a trench isolation oxide (e.g., a shallow trench isolation (STI) region), and in various embodiments, the first oxide 6 can abut and surround one or more of the silicon substrate 4, SiGe layer 8, silicon layer 10, second oxide 12.

The pre-process illustrated in FIG. 1A can include forming a resist layer 16 over the sacrificial layer 14 including a set of openings 18 (two shown) exposing the sacrificial layer 14. In various embodiments, the resist layer 16 is deposited over the sacrificial layer 14, and subsequently exposed using a photomask such as a chrome-based mask in a photolithography process, known to those skilled in the art. Exposing the resist layer 16 forms a pattern (including openings 18).

Figure 1B:
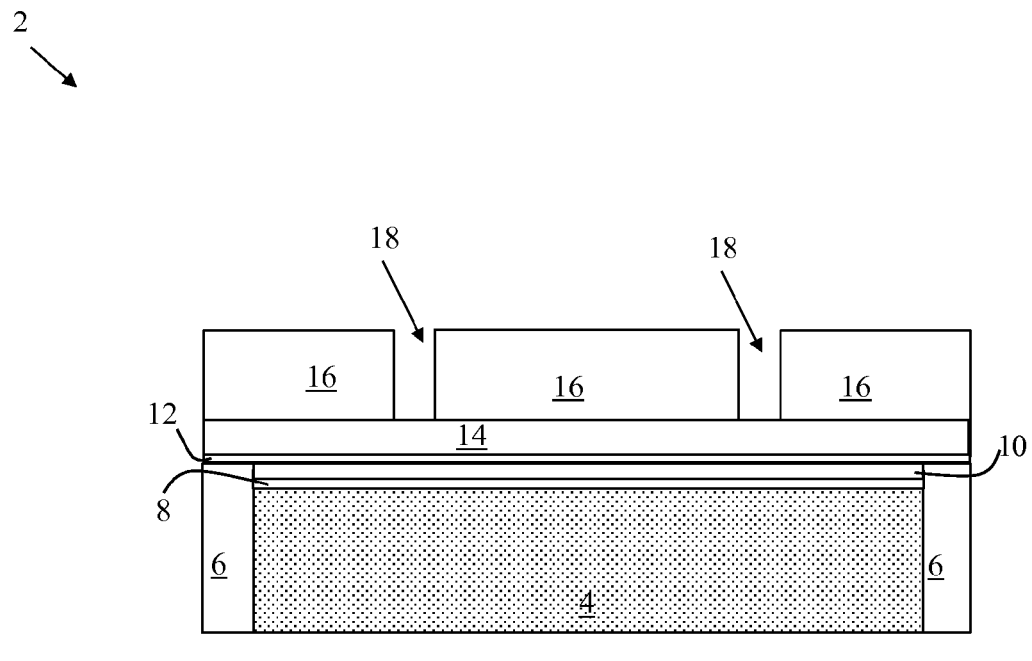

According to an optional alternative embodiment, illustrated in FIG. 1B, the first oxide 6 can be formed by a conventional shallow trench isolation (STI) process, wherein the SiGe layer 8 and the Si layer 10 are part of a precursor structure as described herein. It is understood that the process illustrated in FIG. 1A and FIG. 1B may be substantially similar, with the difference being that the precursor structure is formed in a different manner.

Illustrated in FIG. 2, following formation of the resist layer 16 over the sacrificial layer 14, the process can further include forming a first set of trenches 20 (two shown) in the precursor structure 2, the trenches 20 each exposing the silicon substrate 4. In some particular embodiments, the forming of the first set of trenches 20 includes etching through the sacrificial layer 14, the second oxide layer 12, the silicon layer 10 and the SiGe layer 8 to expose the silicon substrate 4. In various embodiments, forming of the trenches 20 includes using a reactive ion etch (RIE) process, the details of which are known to those having skill in the art. In various embodiments, the etching includes performing a non-selective SiGe/oxide/Si (SOS) etch to expose the silicon substrate 4.

Figure 2A:
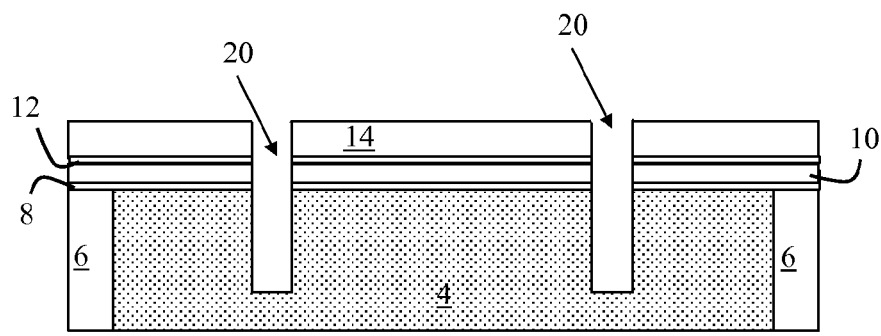

FIG. 2A illustrates an additional process of stripping (removing) the resist layer 16 after forming the trenches 20 each exposing the silicon substrate 4. Following stripping (removing) the resist layer 16, an additional process can include forming a protective spacer along the cavities 20 to protect the sidewall of the silicon layer 10 within the cavity from subsequent etching (e.g., etching shown and described with reference to FIG. 4).

Figure 2B:
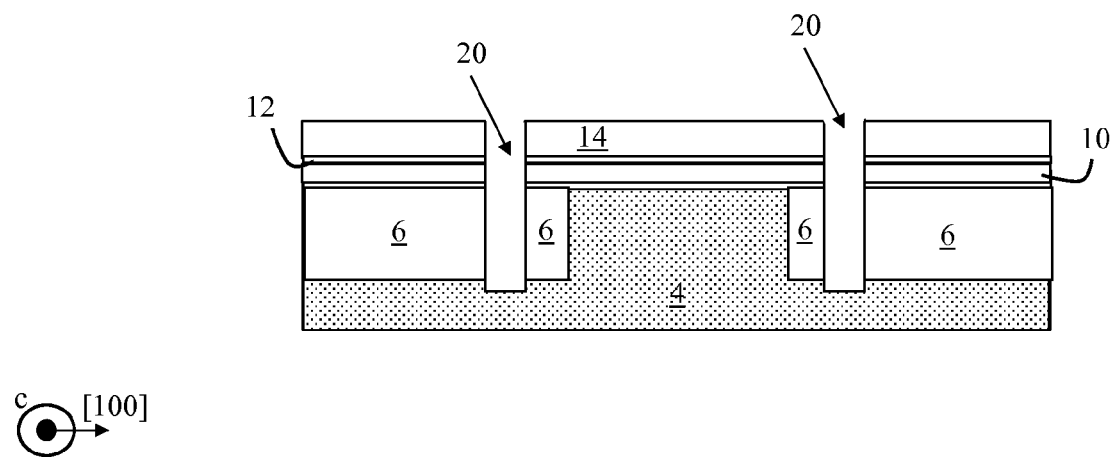

FIG. 2B shows an alternative embodiment, shown in a side cross-sectional view, where cavities 20 are etched through the first oxide layer 6 as well as into the silicon substrate 4. In this case, the exposed sidewall of the silicon layer 10 can be protected by the first oxide layer 6 during the subsequent etching process, shown and described with reference to FIG. 4.

Figure 3:
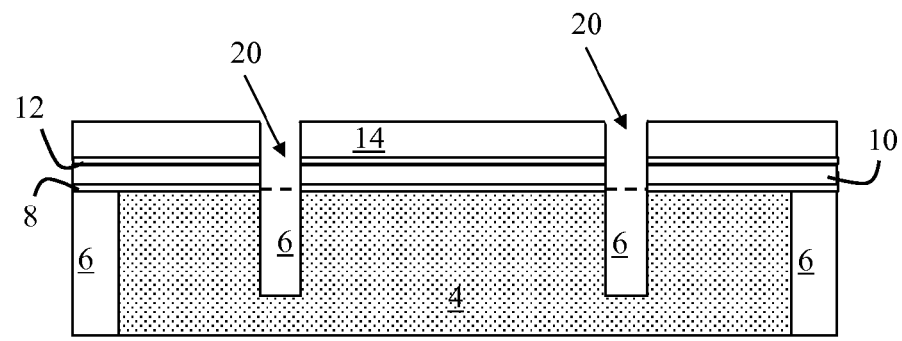
Figure 3:
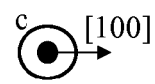

FIG. 3 illustrates the IC structure of FIG. 2, showing the remaining first oxide 6 in phantom, surrounding the silicon substrate 4 including the first set of trenches 20. It is understood that the first oxide 6 surrounds the silicon substrate 4, and as such, looking through the first set of trenches 20 from this cross-sectional view will show the first oxide 6 behind the silicon substrate 4. The remaining views of the IC structure undergoing processing do not all show the first oxide 6 behind the silicon substrate 4 for the purposes of clarity in illustration. However, it is understood that the first oxide 6 is present around the silicon substrate after the forming of the first set of trenches 20 (as well as after subsequent steps noted herein). In any case, the first set of trenches 20 each expose the silicon substrate 4 and internal sidewalls of the first oxide 6.

Figure 4A:
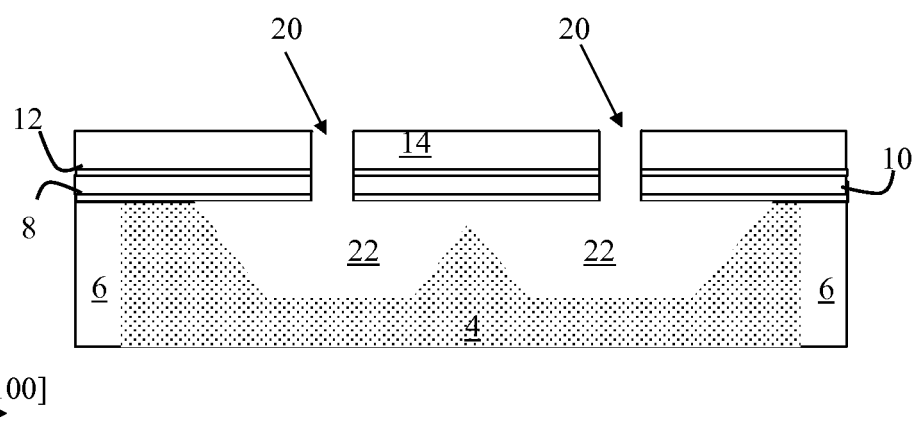
Figure 4B:
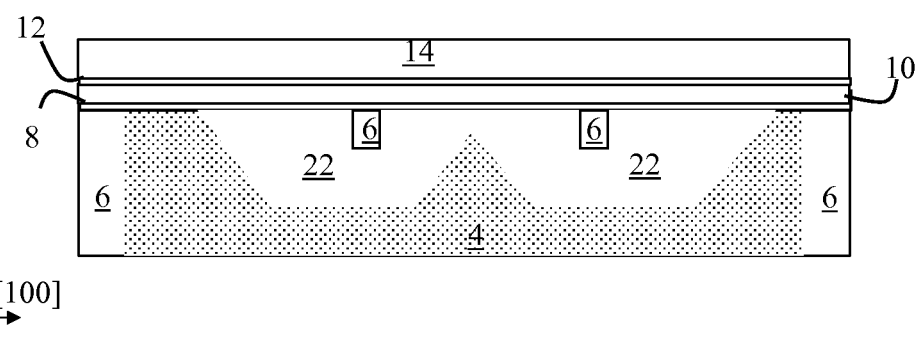
Figure 6:
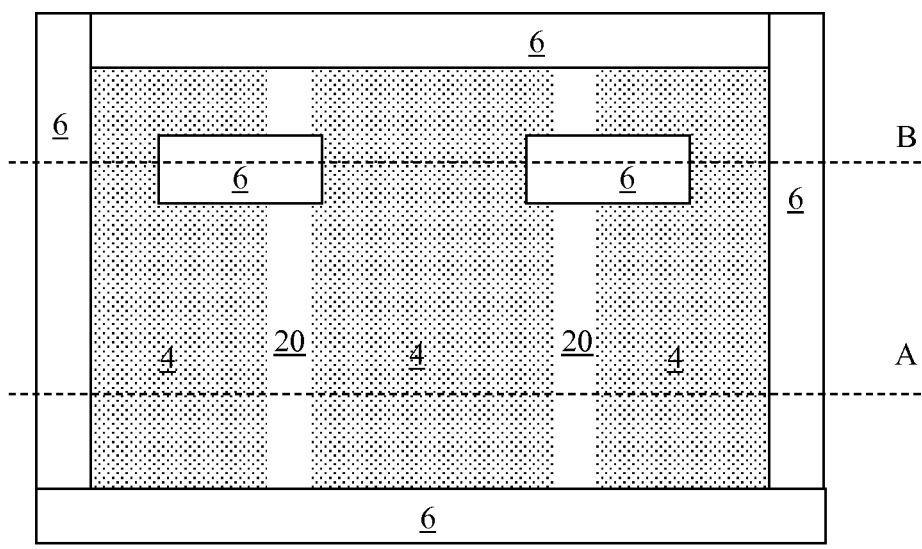

FIG. 4A, and FIG. 4B illustrate another process of undercut etching the silicon substrate 4 in a direction perpendicular ([100]) to the crystal direction (c) of the silicon substrate 4 to form a cavity 22 corresponding with each of the first set of trenches 20, corresponding to the cross-section along line A, and B of FIG. 6, respectively. In some embodiments, the undercut etch removes the silicon substrate 4 exposing portions of the underside of the SiGe layer 8. It is understood that the portion of the structure that appears suspended in this view is actually anchored to the silicon substrate 4 and the first oxide 6 along the crystal direction (c), not visible in the cross-sectional depiction in FIG. 4A. FIG. 4B shows the first oxide 6 visible behind the first set of trenches 20 (FIG. 3), as discussed with reference to FIG. 3. In various embodiments, the undercut etching is performed using a wet chemical etch, e.g., ammonia hydroxide etching or potassium hydroxide etching. These wet chemical etches are crystalline-dependent, meaning that these etches have different speeds in different directions. The depth of the cavities 22 formed via the undercut etch described with reference to FIG. 4A and FIG. 4B is dictated by both: a) the depth of the trenches 20, as well as b) the width of the undercut etch.

Figure 5:
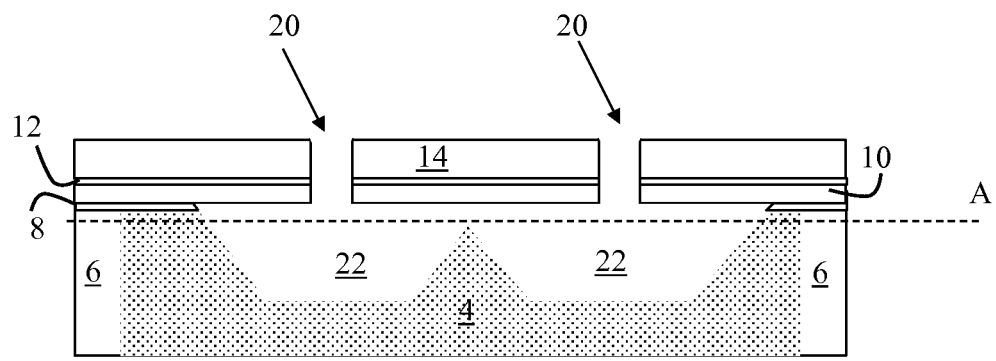
Figure 5:
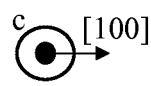

FIG. 5 illustrates an optional process of selectively removing a portion of the SiGe layer 8 underlying the silicon layer 10 within the cavity 22. In some cases, this optional process can be performed using an isotropic reactive ion etch (RIE), a dry etch or a chemical etch, which etches the SiGe 8 selectively to the silicon layer 10 within the cavity 22. In various embodiments, the isotropic RIE on the SiGe layer 8 is performed after the undercut etching, and removes the SiGe layer 8 along a bottom surface of the silicon layer 10 within each cavity 22, exposing the bottom surface of the silicon layer 10 within each cavity 22.

FIG. 6 shows a top-down view of a portion of the structure shown in FIG. 5. As shown, in various embodiments, the first oxide 6 can include an STI oxide, and can substantially surround the silicon substrate 4 in some cases. In various embodiments, the first oxide 6 (e.g., STI oxide) can physically support the center region of the silicon substrate 4 (as well as overlying layers), that is separated from other portions of the silicon substrate 4 by trenches 20 (and cavities 22, shown in FIG. 5). The first oxide 6 can support this center region of the silicon substrate 4 at least until subsequent filling of the cavities 22.

Figure 7:
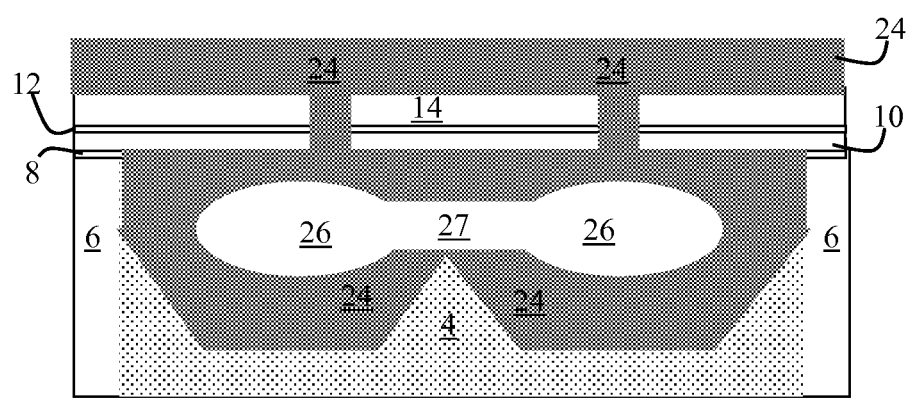
Figure 7:
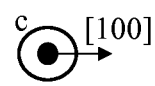

FIG. 7 illustrates an additional process including: a) passivating at least one of the exposed surfaces of the silicon layer 10 within the trenches 20 or the exposed surfaces of the SiGe layer 8 in the trenches 20; and at least partially filling each of the cavities 22 (and trenches 20) with a dielectric (e.g., a third oxide) 24. In various embodiments, passivating the exposed surfaces of the silicon layer 10 and/or the exposed surfaces of the SiGe layer 8 within the trench(es) 20 includes performing a rapid thermal oxidation (RTO) process or a dry oxidation process on the silicon layer 10 and/or the SiGe layer 8. In various embodiments, partially filling the cavities 22 with the dielectric 24 can include conformally depositing a silicon dioxide film, e.g., via low-pressure chemical vapor phase deposition (LPCVD) with a low pressure tetrathoxysilane (LP-TEOS) along the sidewalls and other exposed surfaces of the silicon substrate 4 and along the underlying surfaces of the silicon layer 10 (or SiGe 8 in some embodiments). In various embodiments, the dielectric (e.g., silicon dioxide) 24 is deposited to fill the trenches 20, and in some cases, the dielectric 24 completely fills the trenches 20 to extend above the SiGe layer 8. According to various embodiments, the dielectric 24 only partially fills the cavity 22, such that it leaves an air gap 26 within each cavity 22, connected with an air gap 26 in an adjacent cavity, otherwise surrounded by the dielectric 24. That is, the dielectric 24 is formed conformally, such that it adheres to surfaces and "builds" inward, leaving the air gap 26. A gap connection 27 is shown between adjacent air gaps 26 in adjacent cavities 22 (not labeled here due to fill from dielectric 24). In various embodiments, the process of partially filling each cavity 22 with the dielectric 24 includes completely filling each of the first set of trenches (20, FIG. 2) with the dielectric 24.

Figure 8:
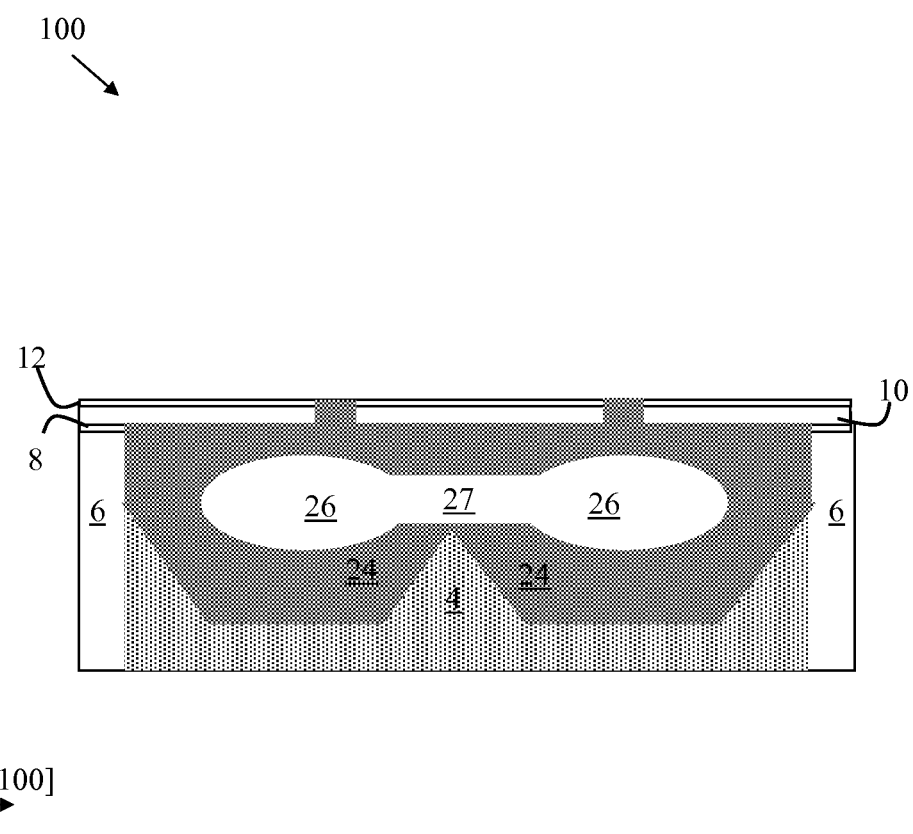

FIG. 8 illustrates another process including etching the dielectric 24 back below the upper surface of the sacrificial layer 14, e.g., via a conventional end-pointed etch. In various embodiments, the process also includes removing the sacrificial layer 14, e.g., via conventional etching. The sacrificial layer 14 can be selectively etched back to expose the second oxide 12.

As shown, FIG. 8 displays one embodiment of a silicon (optical) waveguide structure (Si waveguide) 100 according to various embodiments. The Si waveguide 100 can include a silicon substrate 4. Substantially abutting the silicon substrate 4 is the first oxide 6. In some cases, the silicon germanium (SiGe) layer 8 overlies the silicon substrate 4 (however, the SiGe layer 8 may be omitted in various embodiments). The silicon layer 10 overlies the SiGe layer 8 (or the silicon substrate 4 and first oxide 6). The second oxide 12 overlies the silicon layer 10. As described and shown with respect to FIGS. 2B, 3, 4A and 4B, the set of cavities 22 can extend into at least one of the silicon substrate 4 or the first oxide 6. As shown, the dielectric 24 (e.g., third oxide layer) partially fills the set of cavities 22 and extends above the silicon layer 10 (e.g., the portion overlying the SiGe layer 8). Air gaps 26 are contained within the dielectric 24, where each set of cavities 22 includes an air gap 26 extending between sets of adjacent cavities (connected by gap connector 27). Each air gap 26 is surrounded by the dielectric 24 (e.g., third oxide), and in some cases, can be enclosed by the dielectric 24. In some particular embodiments, each air gap 26 is surrounded by the dielectric 24 (e.g., third oxide) except for a connection (gap connector 27) with the air gap 26 in the adjacent cavity. In various embodiments, the air gap 26 can be minimized as much as possible.

The Si (optical) waveguide 100 of FIG. 8 can provide significant cost benefits when compared with conventional SOI waveguide structures. As the Si (optical) waveguide 100 is built on a bulk Si substrate, material costs can be significantly less than conventional SOI waveguide structures, and further, the Si (optical) waveguide 100 can also allow for enhanced flexibility in integrating other devices including complementary-metal-oxide semiconductor field-effect transistors (CMOS FETs) with the Si waveguide 100 when compared to convention SOI waveguide structures.

Figure 9:
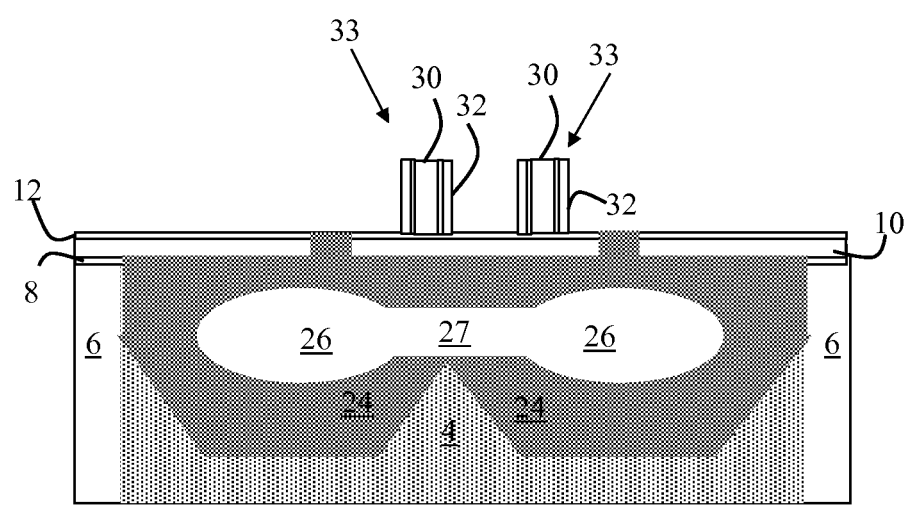
Figure 9:
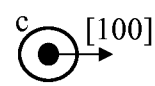

FIG. 9 illustrates an optional additional process of forming a gate 30 and spacers 32 over the second oxide layer 12 (or the re-grown gate oxide 28, if optional process in FIG. 9 is performed), which can be formed, for example over one or more various regions of the Si waveguide 100 so that one or more CMOS FETs are integrated monolithically with Si waveguide(s) 100. This includes conventional processes of depositing a gate metal along with insulators (spacers 32) to form an active device (e.g., a FET).

Figure 1B:
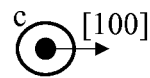

Various additional embodiments can include processes in forming the precursor structure 2 of FIG. 1, for example:

Process P1: growing the SiGe layer over the silicon substrate;

Process P2: growing the silicon layer over the SiGe layer;

Process P3: depositing the second oxide over the silicon layer; and

Process P4: depositing the sacrificial layer over the second oxide layer.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method comprising:
    forming a first set of trenches in a precursor structure having:
        a silicon substrate having a crystal direction, the silicon substrate substantially abutted by a first oxide;
        a silicon germanium (SiGe) layer overlying the silicon substrate;
        a silicon layer overlying the SiGe layer;
        a second oxide overlying the silicon layer; and
        a sacrificial layer overlying the second oxide,
    wherein the first set of trenches each expose the silicon substrate and internal sidewalls of the first oxide;
    undercut etching the silicon substrate in a direction perpendicular to the crystal direction of the silicon substrate to form a cavity corresponding with each of the first set of trenches; and
    at least partially filling each cavity with a dielectric, leaving an air gap within each cavity connected with an air gap in an adjacent cavity.

2. The method of claim 1, further comprising forming the precursor structure prior to the forming of the first set of trenches, the forming of the precursor structure including:
    growing the SiGe layer over the silicon substrate;
    growing the silicon layer over the SiGe layer;
    depositing the second oxide over the silicon layer; and
    depositing the sacrificial layer over the second oxide layer.

3. The method of claim 1, wherein the dielectric includes a third oxide.

4. The method of claim 1, further comprising removing the sacrificial layer.

5. The method of claim 4, wherein the removing of the sacrificial layer includes selectively etching the sacrificial layer to expose the second oxide layer.

6. The method of claim 1, further comprising forming an optical waveguide structure within the silicon layer over the SiGe layer.

7. The method of claim 1, further comprising performing an etch on the SiGe layer after the undercut etching to remove the SiGe layer along a bottom surface of the silicon layer within each cavity, exposing the bottom surface of the silicon layer within each cavity.

8. The method of claim 1, wherein the forming of the first set of trenches includes forming a resist layer over the sacrificial layer and etching through the sacrificial layer, the second oxide layer, the silicon layer and the SiGe layer to expose the silicon substrate.

9. The method of claim 1, wherein the partially filling of each cavity with the dielectric includes filling a portion of each cavity to leave the air gap in each cavity, the air gap surrounded by the dielectric except for a connection with the air gap in the adjacent cavity.

10. The method of claim 1, wherein the partially filling of each cavity with the dielectric includes completely filling each of the first set of trenches with the dielectric.

11. A method comprising:
    forming a first set of trenches in a precursor structure having:
        a silicon substrate having a crystal direction, the silicon substrate substantially abutted by a first oxide;

a silicon germanium (SiGe) layer overlying the silicon substrate;
a silicon layer overlying the SiGe layer;
a second oxide overlying the silicon layer; and
a sacrificial layer overlying the second oxide,
wherein the first set of trenches each expose the silicon substrate and internal sidewalls of the first oxide;
undercut etching the silicon substrate in a direction perpendicular to the crystal direction of the silicon substrate to form a cavity corresponding with each of the first set of trenches, wherein the SiGe layer acts as an etch stop layer during the undercut etching; and
at least partially filling each cavity with a dielectric, leaving an air gap within each cavity connected with an air gap in an adjacent cavity, wherein the partially filling of each cavity with the dielectric includes filling a portion of each cavity to leave the air gap in each cavity, the air gap surrounded by the dielectric.

12. The method of claim 11, further comprising forming the precursor structure prior to the forming of the first set of trenches, the forming of the precursor structure including:
growing the SiGe layer over the silicon substrate;
growing the silicon layer over the SiGe layer;
depositing the second oxide over the silicon layer; and
depositing the sacrificial layer over the second oxide layer.

13. The method of claim 11, further comprising performing an isotropic reactive ion etch (RIE) on the SiGe layer after the undercut etching to remove the SiGe layer along a bottom surface of the silicon layer within each cavity, exposing the bottom surface of the silicon layer within each cavity, prior to the at least partially filling of each cavity.

14. The method of claim 11, wherein the air gap in each cavity is surrounded by the dielectric except for a connection with the air gap in the adjacent cavity.

15. The method of claim 11, further comprising removing the sacrificial layer by selectively etching the sacrificial layer to expose the second oxide layer.

16. The method of claim 11, further comprising forming an optical waveguide structure within the silicon layer overlying the SiGe layer.

17. The method of claim 11, wherein the forming of the first set of trenches includes forming a resist layer over the sacrificial layer and etching through the sacrificial layer, the second oxide layer, the silicon layer and the SiGe layer to expose the silicon substrate.

18. The method of claim 11, wherein the at least partially filling of each cavity with the dielectric includes depositing the dielectric to completely fill each of the first set of trenches with the dielectric.

19. The method of claim 18, wherein the depositing of the dielectric to completely fill each of the first set of trenches includes further depositing the dielectric over the sacrificial layer, and planarizing the dielectric over the sacrificial layer after the depositing of the dielectric over the sacrificial layer.

* * * * *